United States Patent [19]
Robinson

[11] Patent Number: 5,087,874
[45] Date of Patent: Feb. 11, 1992

[54] APPARATUS AND METHOD FOR LOCATING A SHORT

[76] Inventor: David Robinson, 72 Redner Road, Morristown, N.J. 07960

[21] Appl. No.: 399,691

[22] Filed: Aug. 28, 1989

[51] Int. Cl.$^5$ ............................................. G01R 27/14
[52] U.S. Cl. .................................. 324/73.1; 324/523; 324/524
[58] Field of Search ............. 324/73.1, 158 R, 158 D, 324/523, 524, 158 F, 537

[56] References Cited

U.S. PATENT DOCUMENTS

| | | | |
|---|---|---|---|
| 3,299,351 | 1/1967 | Williams | 324/524 |
| 3,986,116 | 10/1976 | Smith et al. | 324/524 |
| 4,377,782 | 3/1983 | Metcalf et al. | 324/524 |

FOREIGN PATENT DOCUMENTS

| | | | |
|---|---|---|---|
| 1307404 | 4/1987 | U.S.S.R. | 324/524 |

*Primary Examiner*—Ernest F. Karlsen
*Attorney, Agent, or Firm*—Thomas L. Adams

[57] ABSTRACT

An apparatus can locate a short between a first and second network with a pair of probes, a measurement device and a current source. The measurement device can measure the potential between the probes. The current source can be connected to the first and second network for injecting between them a current in excess of ⅛ Amp. A larger system can use a matrix connected between a plurality of probes and the measurement device. The matrix can selectively connect a selected one of the probes to the measurement device. This larger system includes a manual keyboard for manually producing a command signal indicating selected pairs of the probes. A processor is coupled to the matrix and the manual keyboard for operting the matrix in response to the command signal to record the potential differences between selected pairs of the probes. A display can spatially display the selected pairs of probes and can also display the polarity of the potential between each of them, as measured by the measurement means. In using the forgoing apparatus one can predict the direction of a short between a first and second network in relation to the polarity between a pair of spaced points in the first network. Another prediction places the short as in a predicted direction where the magnitude of current appears to either increase or sharply fall toward zero.

12 Claims, 8 Drawing Sheets

APPARATUS AND METHOD FOR LOCATING A SHORT

BACKGROUND OF THE INVENTION

The present invention relates to apparatus and methods for locating a short between two networks, such as a power and ground plane in a printed circuit board.

Modern printed circuit boards can be extremely difficult to troubleshoot. Even before being populated with electrical components, boards can be extremely complicated and have hundreds of feed-through holes connecting multiple circuit layers. These complex circuit boards can have a short circuit between two normally isolated, but rather extensive networks. For example, a short between a ground plane network and another extensive network such as the power lines, power planes or the reset lines can be very difficult to troubleshoot, given the large area over which a fault can occur.

When circuit components are installed in such a circuit board, the complexity increases and additional faults can occur from defective components, solder that may form a bridge between adjacent circuit traces etc. Accordingly, it can be easy to determine a short exists, but very difficult to locate such a short.

When a short occurs between the power and ground networks special difficulties exist. First, the circuit cannot be powered and conventional troubleshooting techniques cannot be applied. Normally, a troubleshooter may use a voltmeter and a oscilloscope to determine whether particular waveforms exist in a proper form at various stages in a circuit. Such troubleshooting is impossible when power cannot be applied to the circuit board. Often the troubleshooter who cannot power the circuit board, is reduced to searching for a short by eye, an obviously time consuming and probably unsuccessful undertaking. Furthermore, for multilayered boards, relevant planes may be buried and visual inspection becomes impossible.

A known method for locating a short circuit is to inject a small current (or a low voltage alternating current) through a conductor involved in a short. The direction of the current can be determined with a voltmeter by observing the voltage drop along the affected conductor. This known method employs a relatively small current, about 10 mA, to avoid overheating and damaging the affected conductors and the components connected to them.

These known techniques do not work well for important classes of printed circuit traces, such as the traces or planes for power and ground. Power and ground planes normally have relatively low resistance, in the order of one milliOhm. Conventional currents do not generate a voltage drop that can be easily measured and therefore tend to be masked by noise. For example, a conventional 10.0 mA current may be divided by alternate circuit paths to a 1.0 mA current flowing through one miliohm of resistance, producing only one microvolt, a rather difficult voltage drop to work with.

Furthermore, since ground planes do not offer a linear path to guide the search for a short, conventional linear tracing techniques do not apply well.

Known techniques for locating a short suggest moving a pair of probes, searching for an optimum response that occurs across the short. However, this technique assumes low impedance at the short. Actually the impedance at the short can vary by several orders of magnitude, making the response at the short unpredictable. When the conductors or planes of a very large network are involved, the number choices becomes so large as to be impossible to examine by the average troubleshooter.

Furthermore, finding shorts between power and ground planes in boards populated with components is extremely difficult with conventional methods because direct current can validly pass from power to ground through various shunting components. For example, injecting alternating currents produces misleading indications because of the bypassing effect of various decoupling components.

A known apparatus for detecting a short (U.S. Pat. No. 4,565,966) measures capacitance at various nodes with respect to a reference network or reference plane. This patent also discusses measuring resistance at two points on each of two networks that are shorted together. This patent suggests that through calculation the resistances to the short can be determined, and therefore, the approximate distance to the short can be found. As before, a short having substantial and unpredictable. This patent also does not determine current direction and does not disclose the appropriate current magnitude.

U.S. Pat. No. 4,001,686 suggests that the magnitude and direction of a current can be measured by an undefined test instrument. The reference, however, does not concern itself with various details including the amount of current that would be appropriate for this task.

It is also known to troubleshoot a large circuit board by placing it upon a grid of pointed pins, also referred to as a "bed of nails." Automatic test equipment can select various pins and inject a stimulating current or voltage. Likewise, another pin can be selected to measure the current or voltage at that point. These known systems can be controlled by a computer so that sequences of stimuli and response can be observed, using a switching matrix that allows the sequential tests to occur. See also U.S. Pat. Nos. 3,714,572; 3,842,346; 4,138,643; 4,454,585; 4,342,957; 4,342,958; 4,345,201; 4,377,782; 4,445,085; 4,730,159; and 4,746,861.

SUMMARY OF THE INVENTION

In accordance with the illustrative embodiments demonstrating features and advantages of the present invention, there is provided a method for locating a short between a first and second network. The method includes the step of injecting current in excess of ⅛ Amp between the first and second network. Another step is initially measuring a voltage drop between a first pair of spaced points in the first network. The method includes the step of determining the polarity of the voltage drop between the first pair of spaced points. Another step is predicting the short as being located in a predicted direction having a predetermined relation to the polarity between the pair of spaced points.

A related method of the same invention can also locate a short between a first and second network by injecting current between them. The method includes the step of initially measuring a voltage drop between a first pair of spaced points in the first network. Another step is remeasuring another voltage drop between a second pair of spaced points in the first network. The method also includes the step of estimating the respective net currents associated with measurements at the first and second pairs of spaced points. The short is predicted as being located in a predicted direction where the magnitude of current appears to either increase or sharply fall toward zero.

Apparatus according to the principles of the same invention can locate a short between a first and second network with a pair of probes, a measurement means, and a current source. The measurement means can measure the potential between the probes. The current source is adapted to be connected to the first and second network for injecting between them a current in excess of ⅛ Amp.

Apparatus according to the same invention can locate a short between a first and second network with a plurality of probes and at least one measurement means for measuring the potential on at least one of the probes. The apparatus includes a matrix means connected between the probe and the measurement means for selectively connecting a selected one of the probes to the measurement means. A current source in the apparatus is adapted to be connected to the first and second network for injecting between them a current. Also included is a manual means for manually producing a command signal indicating selected pairs of the probes. A processing means of the apparatus is coupled to the matrix means and the manual means for operating the matrix means in response to the command signal, to record the potential difference between the selected pairs of the probes. The apparatus includes a display means for spatially displaying the selected pairs of the probes and displaying the polarity of the potential between each them, as measured by the measurement means.

By employing apparatus and methods of the forgoing type, an improved technique is achieved for locating shorts between networks. In one preferred embodiment, relatively large currents flow in power or ground planes to generate voltages in the millvolt range that are large enough to be easily and accurately measured. Notwithstanding the use of substantially large currents, little heat is generated because the current flows through such small resistance, and current source compliance is small. Power dissipation in the affected circuit traces are in the milliwatt range.

In one preferred apparatus, a troubleshooter manually searches for shorts with a fixed current source. The current source has a safety shunt, so that current injected into a relatively high impedance does not produce either high voltage or high power dissipation. Thus the circuit under test is adequately protected. This preferred apparatus can include a digital voltmeter having a pair of pointed probes. By using the digital voltmeter, a relative indication of the magnitude and direction of current flow can be determined.

In an automated version, a "bed of nails" can have its various pins selected by a computer controlling a switching matrix. In this arrangement, current can be injected between a power to ground plane to locate the short. (It will be appreciated that shorts between other networks can be examined as well.) In this example, a troubleshooter selects pins by typing onto a keyboard the coordinates of the pins. A CRT display can show the pins graphically, connected perhaps by a vector to show polarity, with the magnitude of current displayed as an adjacent number.

The operator can initially display a particular circuit area (in the beginning the entire circuit board) and can begin by selecting pairs of pins, observing the pattern of current flowing in the circuit board. As the areas of interest become more focussed, a smaller and more detailed portion of a circuit board can be examined by giving appropriate commands through the keyboard.

Preferably, a short can be determined by measuring the voltage drop between pairs of selected points. The direction of current will generally indicate the direction towards the short. In addition, measuring the voltage drop across a circuit trace can identify the short by the fact that the current either rapidly drops to zero or reverses polarity.

In a highly automated embodiment, the automatic test equipment can assemble measurements with respect to a center point among the pins of a test bed. The voltages with respect to this starting point are measured to determine whether current flows towards this starting pin. If not, another pin is selected and voltages around that pin are measured. The next pin selected is the one having the largest current flowing towards it. In this fashion a short can be identified when all of the voltages with respect to the last selected pin have the same polarity, indicating all current flows towards that pin.

In the same highly automated embodiment, multiple shorts can be located by next choosing a pin near one of the corners of the board under test. As before, voltages with respect to that starting pin are measured to determine if all current is flowing towards the starting pin. As before, the pin receiving the largest current flow is chosen next, and the process repeats until one pin is found having all current flowing toward it.

BRIEF DESCRIPTION OF THE DRAWING

The above brief description as well as other objects, features and advantages of the present invention will be more fully appreciated by reference to the following detailed description of presently preferred, but nonetheless illustrative embodiments and in accordance with the present invention when taken in conjunction with the accompanying drawings wherein.

DETAILED DESCRIPTION OF THE PREFERRED EMBODIMENT

Figure 1:
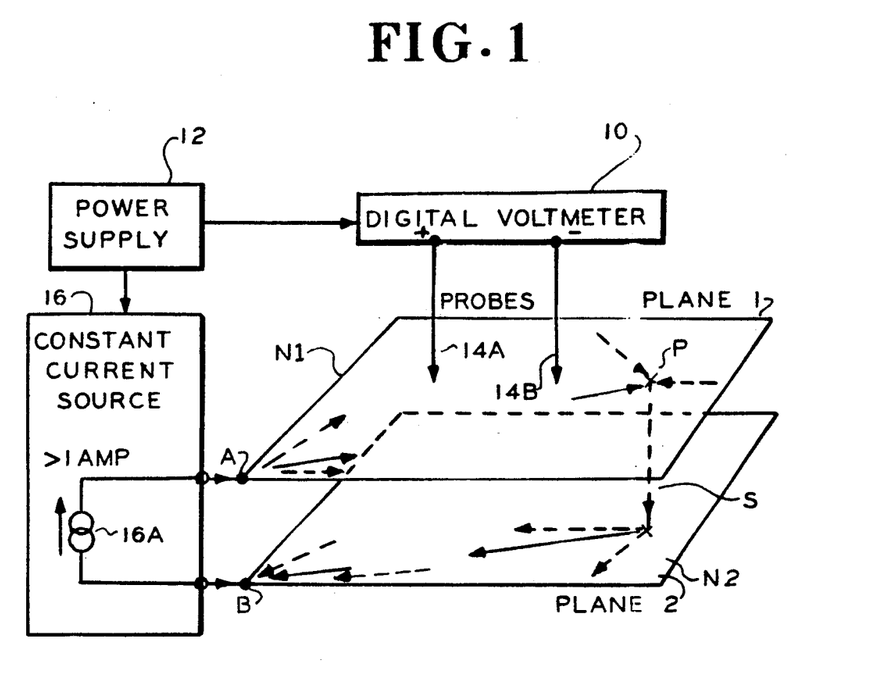
FIG. 1 is a schematic diagram showing apparatus and method for finding shorts between circuit networks or planes, in accordance with the present invention.

Referring to FIG. 1, a very schematic diagram is given. A first network N1 and a second network N2 are shown herein as a power and ground plane, respectively. While continuous planes are shown for networks N1 and N2, in some practical embodiments a plane will be interrupted with various cut-outs or be shaped as a grid work. A short S is illustrated connecting plane N1 and plane N2 as indicated. A measurement means 10 powered by a power supply 12, is shown herein as a digital voltmeter having a pair of probes 14A and 14B connecting to a pair of points in the plane of network N1. Power supply 12 also energizes current source 16, shown herein having a source 16A of at one least 1 Amp, although in some embodiments the current may be ⅛th Amp or greater. Alternatively, the current source can be one half Amp or greater.

As illustrated, current source 16A is connected at respective corners of networks of N1 and N2. As illustrated by the vectors, current diverge from the connection point A of current source 16A to diverge at the short P. In this embodiment, because the affected conductors are as broad one can expect, the current is set at a maximum amount of at least one Amp. It will be understood that for narrow circuit traces the current will be reduced.

If one knows the location of the short P, one would find the maximum voltage drop to be along line AP. One can determine the general direction of point P by measuring voltages from point A to points on an arc around point A. The largest voltage will generally indicate the direction of point P. As an alternative, by moving probes 14A and 14B along edges of network plane N1, one can determine the approximate coordinates of the short S. Measurements along an edge of network plane N1 will indicate an increasing current density as one gets nearer to the coordinate of the short. When past the short, the current will change very little since there is relatively little current past the short P.

With an approximate location of the short obtained in this fashion, one can probe around the vicinity of point P. By keeping the probes at an approximately equal spacing one can find where the highest current density, and therefore, largest voltage drop occurs. When one gets the pair of voltage probes 14A and 14B about point P, the voltage drop will reverse or fall precipitously. Thereafter, one or the other probe can be moved inward until the voltage reaches a maximum. In this iterative fashion, the location of the short P can be rapidly determined.

It will be noted that if one moves the probes from one side of the short P to the other, the polarity of the voltage reading reverses. This significant fact enables one to locate the probes as being to one side or the other of the short. Accordingly, it is important to keep the probes oriented in such a way that polarity is easily determined by the troubleshooter.

Figure 2:
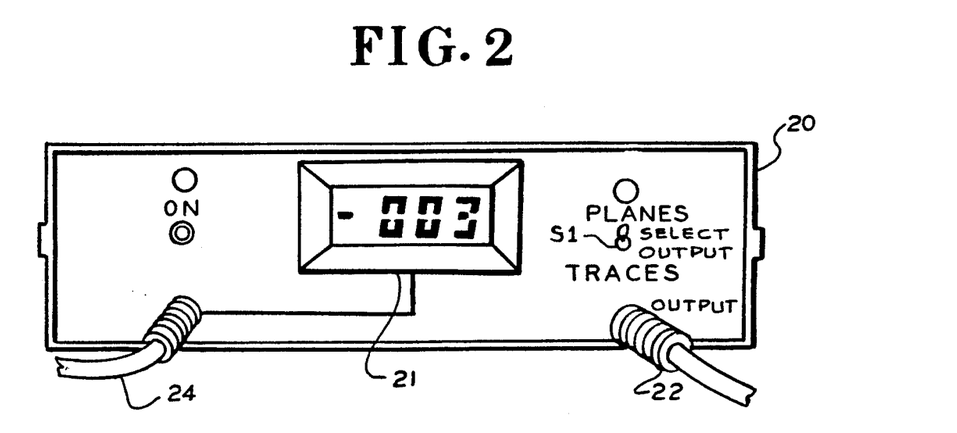
FIG. 2 is a frontal view of the front panel of the apparatus of FIG. 1.

Referring to FIG. 2, a case 20 includes a digital voltmeter having a seven-segment, numeric display 21. The leads for the constant circuit source are shown as cable 22. The voltage on cable 24 is displayed by the digital panel meter 21. Switch S1 is shown having a "PLANES" and "TRACES" position. The Planes position is a high current position in which 1.2 Amp is supplied through leads 22. In the Traces position, 150 mA is provided through leads 22. The latter situation applies when relatively narrow signal trace are being investigated. Under those circumstances excessive current should not be applied through the signal traces or the readings on display 21 may go out of range.

Figure 3A:
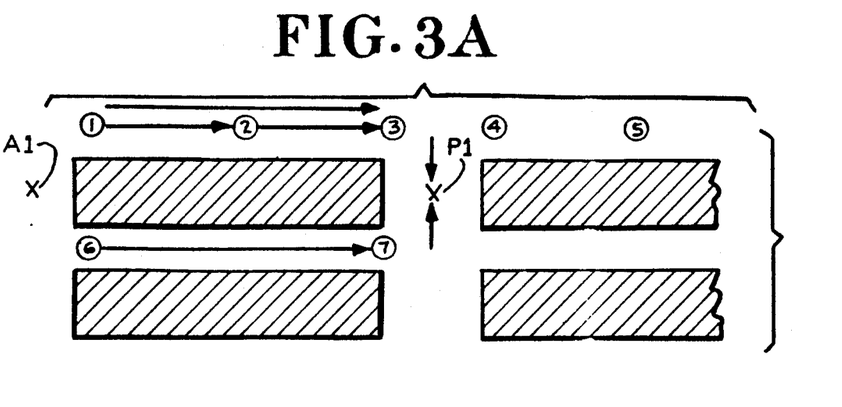
FIGS. 3A-3E are examples of circuits of various types having shorts.

Referring to FIG. 3A, a more realistic ground plane is illustrated. In this example current is injected at point A1 to flow as indicated along lines 1-3 and 6-7. In locating short at position P1, a troubleshooter will find that the voltage drop along lines 1-3 and 6-7 are about equal. The drop along line 4-5 will be zero, or perhaps a slightly negative value.

Also, the drop along line 1-3 will be twice that along line 2-3. With this arrangement, progression down points 1 to 5 will indicate that the voltage drop is substantial until the drop along line 3-4 is measured. At this time a substantial decrease in voltage drop will occur. Along line 4-5, a zero or small negative voltage drop occurs. Thus in the vicinity of the short at point P1, the voltage drop will either precipitously fall in magnitude or, perhaps, reverse polarity.

Figure 3B:
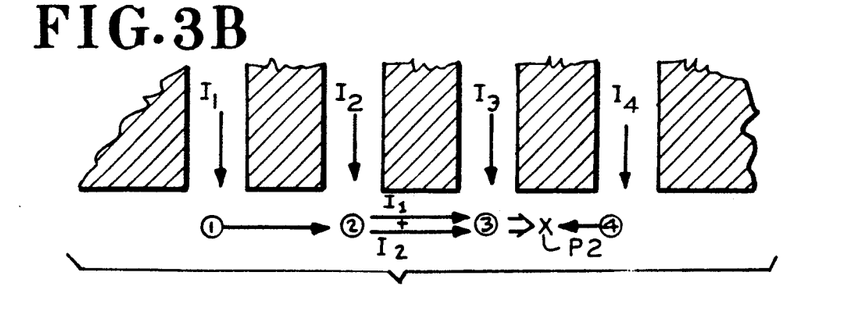

In the example of FIG. 3B, currents $I_1$-$I_4$ each contributes a component of current to the short at point P2. It will be noted that a measurement along pair 1-2 observes a smaller voltage drop than along pair 2-3. As illustrated, the drop along pair 2-3 is greater due to the additional contribution of current $I_2$. Moreover, the voltage drop from across pair 3-P2 is a maximum and greater than the drop along pair 3-4, due to the negative influence of the reverse current $I_4$.

Figure 3C:
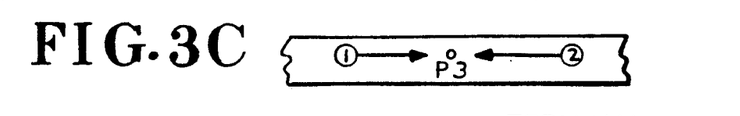
Figure 3D:
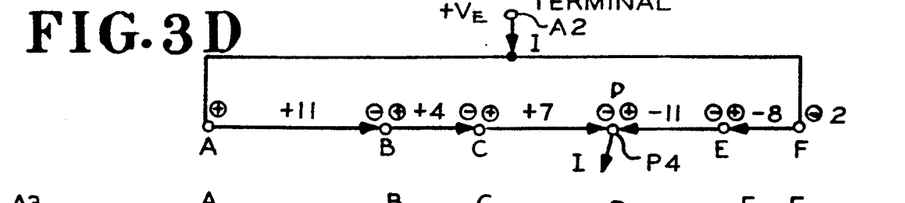

The arrangement of FIG. 3C focuses on a point of possible confusion to be avoided. In those instances where on an initial measurement, the probes just happen to straddle a short by about the same amount, a zero reading is given. This may at first suggest that this area is not interesting. (Of course, using the above methodical method, one would not consider a small or zero voltage drop uninteresting.) However, moving one probe half way towards the other can produce significant changes. For example, moving the probe at position 1 half way towards position 2 produces the very dramatic increase in voltage between pair 2-P3. Referring to FIG. 3D, it shows a current injected at point A2 and branching in two directions to reach a short at point P4. This condition may occur when tracking shorts along signal leads, as opposed to ground planes or power leads. The reuniting of the current produces a polarity reversal at the point of short. Thus one can make successive measurements along pairs A-B, B-C, C-E and E-F. A polarity reversal will be noted at pairs C-E (reading is −4), suggesting a short about point D.

Figure 3E:
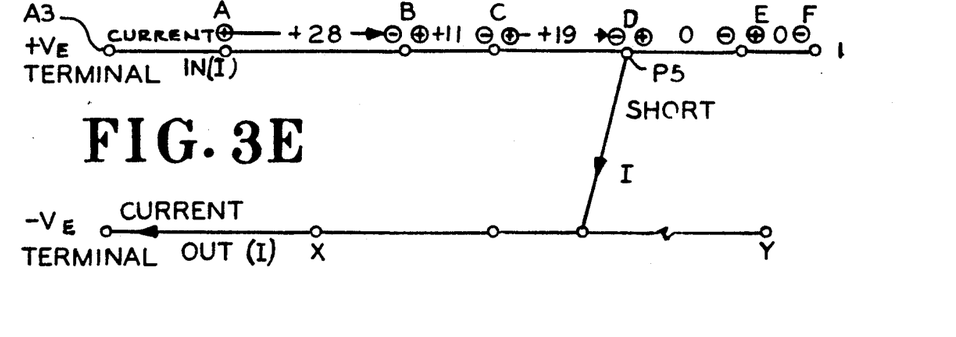

In the situation shown in FIG. 3E, current is injected at point A3 to flow along a signal path to a short at point P5. In this instance successive measurements can be made across pairs A-B, B-C, C-E, and E-F, but with different results. The polarity across pair C-E will not reverse, but will remain at a modest value. The voltage drop across pair E-F will be zero. This indicates a short existing most likely between pair C-E. Successive converging of the probes will eventually find a short at point D (as before with FIG. 3D).

Figure 4:
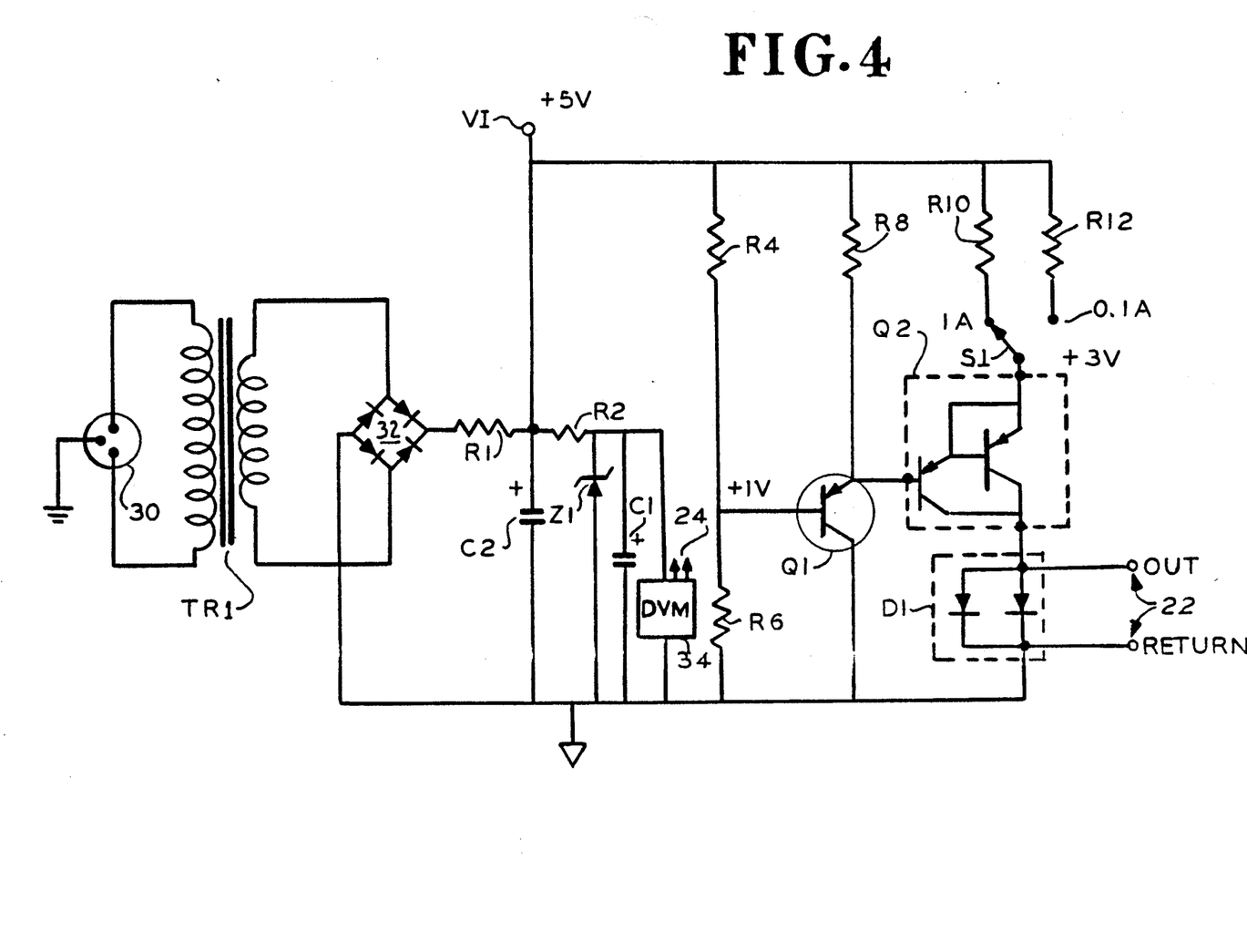
FIG. 4 is a schematic diagram showing further detail of the limited current source used in connection with the apparatus of FIG. 2.

Referring to FIG. 4, power plug 30 is connected to the primary of step down transformer TR1, whose secondary is connected to the input of full-wave rectifier bridge 32. The negative output lead of bridge 32 is grounded, its positive output lead being connected through serially connected resistor R1 to terminal V1. A filtering capacitor C1 is connected between terminal V1 and ground. Terminal V1 is connected through resistor R2 to the cathode of regulating zener diode Z1 whose anode is grounded. Filtering electrolytic capacitor C2 is connected in parallel across zener diode Z1 and the power leads of digital voltmeter 34. Digital voltmeter 34 can be any type of high input impedance, voltage measuring instrument. In the constructed embodiment, a Modutec model number 176-301 was employed.

Terminal VI is indicated as +5 volts and has serially connected between it and ground, resistors R4 and R6. The junction of resistors R4 and R6 is connected to the base of PNP resistor Q1 whose collector is grounded and whose emitter is connected through resistor R8 to line VI and to the base of Darlington pair Q2. The output emitter of pair Q2 is connected to the wiper of switch S1 to connect alternatively through either resistor R10 or resistor R12 to potential line VI. The common collectors of Darlington pair Q2 connect to the anodes of parallel diodes D1 whose cathodes are connected to ground.

With the foregoing arrangement, power is supplied to digital voltmeter 34 so that voltage can be measured as previously described by probes 24. Power applied along line VI produces a constant current from the collector of Darlington pair Q2, as follows: Assuming a constant voltage at line VI, the voltage at the base and the emitter of transistor Q1 is fairly constant. Likewise, the voltage at the output emitter of Darlington pair Q2 is fairly constant so that the current through either resistor R10 or R12 (whichever is selected) will be constant and substantially the same as the current provided through the common collectors of Darlington pair Q2. In the disclosed embodiments, the current is either 1.0 or 0.1 Amp depending upon on the position of S1.

Parallel Schottky diodes D1 limit the amount of voltage across output leads 22. In a well understood fashion, should leads 22 be connected to an open circuit, the fixed current will then flow through redundant, parallel diodes D1 to produce a voltage drop of approximately 0.3 volts. Consequently, diode pair D1 acts as a voltage limiter, as well as a current shunt.

Figure 5:
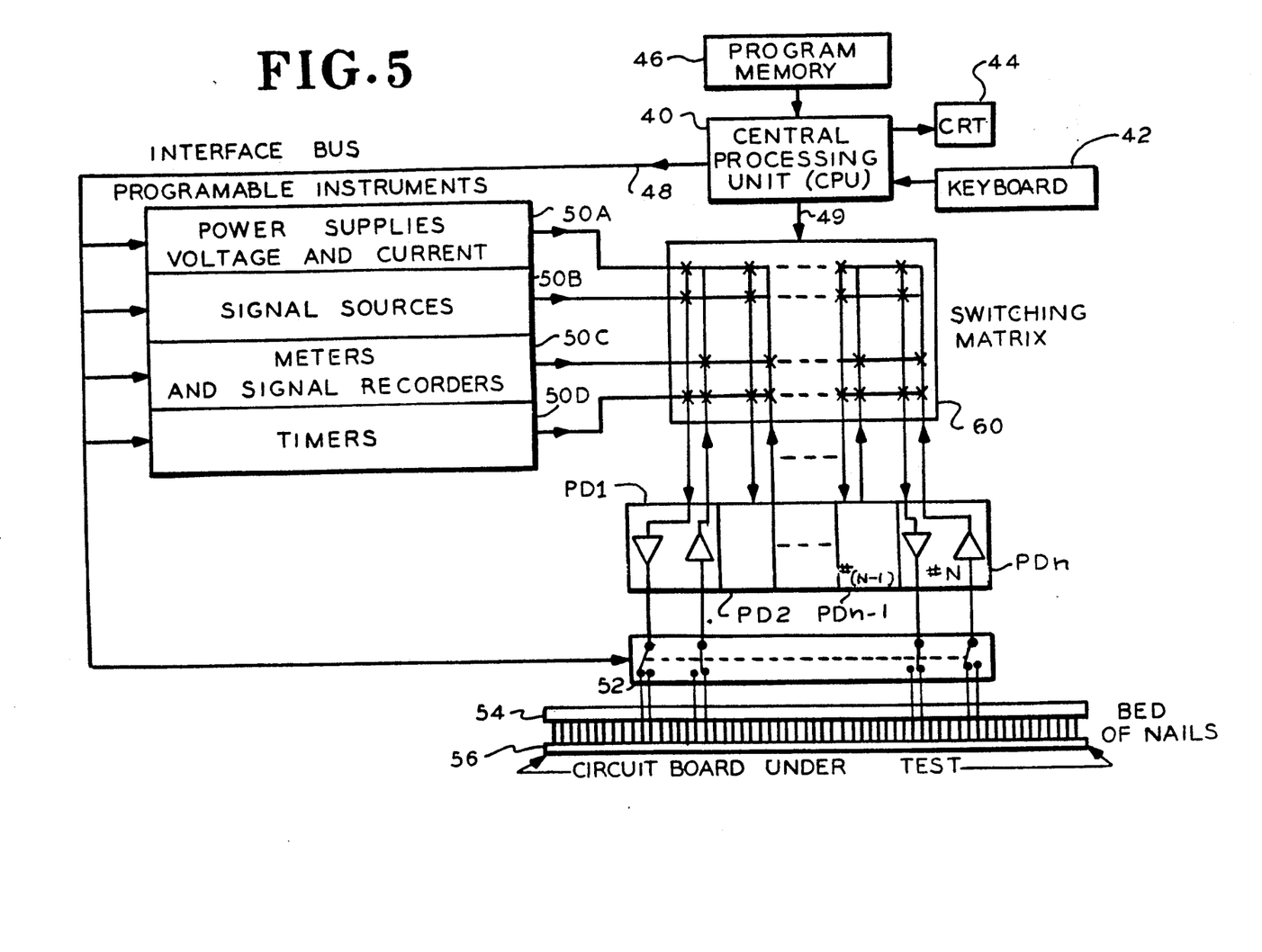
FIG. 5 is a schematic diagram showing a testing system, using a computer-controlled switching matrix, according to the principles of the present invention.

Referring to FIG. 5, an automated test system is shown, employing a processing means 40 that may be in the form of a microcomputer, minicomputer or mainframe computer, depending upon the complexity of the tests conducted. Keyboard 42 functions as a manual means to provide command signals to the central processing unit 40. Output displays are provided to a cathode ray tube 44 acting herein as a display means. A program is contained in a conventional memory 46 which memory may be of various types including read only memory, disk drives, tape drives, etc.

Control lines 48 from processing means 40 are connected in parallel to instruments 50A-50D. Computer 40 provides along lines 48 digital data to control the operating conditions of the instruments 50A-50D. As illustrated, instruments 50A may include digitally controlled power supplies which respond to digital signals to provide a regulated voltage or current. A regulated current can be used to provide the current that is to be measured when attempting to locate a short between network. In addition, the power supplies can provide a voltage, to power the unit under test.

Other signal sources in instrument rack 50B can provide alternating currents, pulses of various types, etc. The instruments of rack 50C can include current meters, voltmeters, ohmeters, capacitance meters etc. Each of these can produce a digital output which is sensed by the computer 40 to indicate measurements made by the instruments in rack 50C. Timers in rack 50D can provide timing signals that are useful for general purpose tests.

Lines 48 also connect to an interface board having a plurality of single pole, double throw switches 52, so that the number of possible connections is effectively doubled. The two switched contacts of switches 52 connect pairs of pins in a "bed of nails" 54. The "nails" may be hundreds of pointed circuit probes arranged in a rectangular matrix to touch circuit traces on a printed circuit board 56.

The wipers of the switches 52 in the interface board connect in pairs to pin drivers PD1, PD2 ... PDn. Pin drivers PD1 are typical in that they have two parallel buffers to transmit an output stimulus and to receive an incoming measurement.

Each of the pairs of channels of pin drivers PD1-PDn is connected to a switching matrix 60. If the connections to pin drivers PD1-PDn are S in number and if the connections from instrument racks 50A-50D are T in number, switching matrix 60 can create $S \times T$ connections. Various techniques and apparatus to perform such a switching feat are known. For present illustrative purposes, each cross over between the indicated lines may be connected by a relay (not illustrated). The connection can be requested by a register (not shown) having $S \times T$ output lines, one per relay. The register is loaded with a digital word from processor 40. It will be understood that practical embodiments may use alternative equipment.

Because of the connection between racks 50A-50D to switching matrix 60, the switching matrix can provide almost any desired stimulus and measurement between the instruments of racks 50A-50B and the "nails" of test bed 54.

Figure 6:
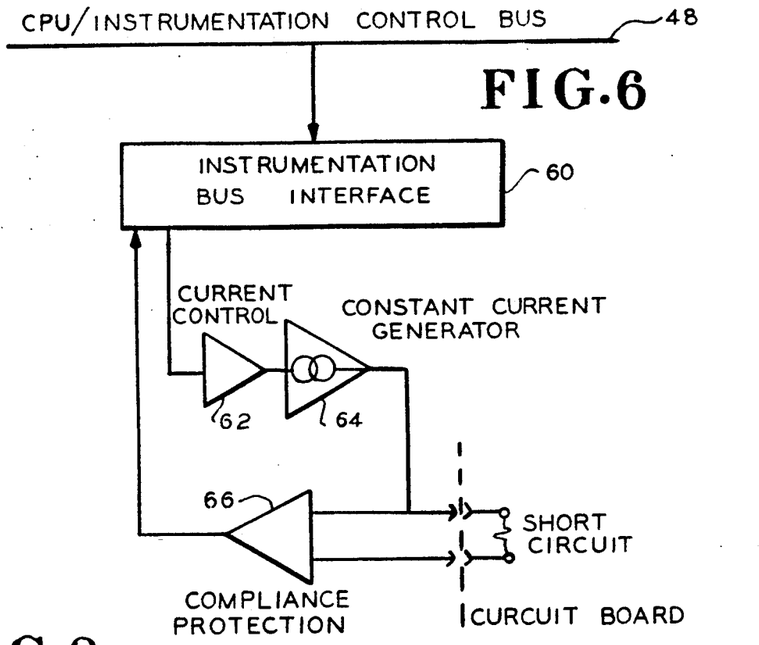
FIG. 6 is a more detailed schematic diagram of a constant current generator that may be used in connection with the apparatus of FIG. 5.

One of the instruments in rack 50B, a constant current generator, is used as described previously to determine a short between networks. FIG. 6 illustrates the hardware used for this purpose. (Alternatively, a current generator specifically designed for this purpose and having its own self-contained compliance circuit can be used instead). Instrumentation bus interface 60 includes a register which stores digital words transmitted along previously mentioned bus 48. The digital words stored in interface 60 provide a control signal to current controller 62 (described in further detail hereinafter) to regulate the current produced by constant current generator 64. This current from generator 64 is schematically shown being routed through the short circuit that exists between the two networks under test. A compliance protection circuit 66 is shown connected in parallel across the short to produce a signal indicative of excessive voltage. This voltage signal is loaded into another register in interface 60 to be read subsequently by the computer along bus 48 to ensure that excessive voltage is not applied to the short being sought.

Figure 7:
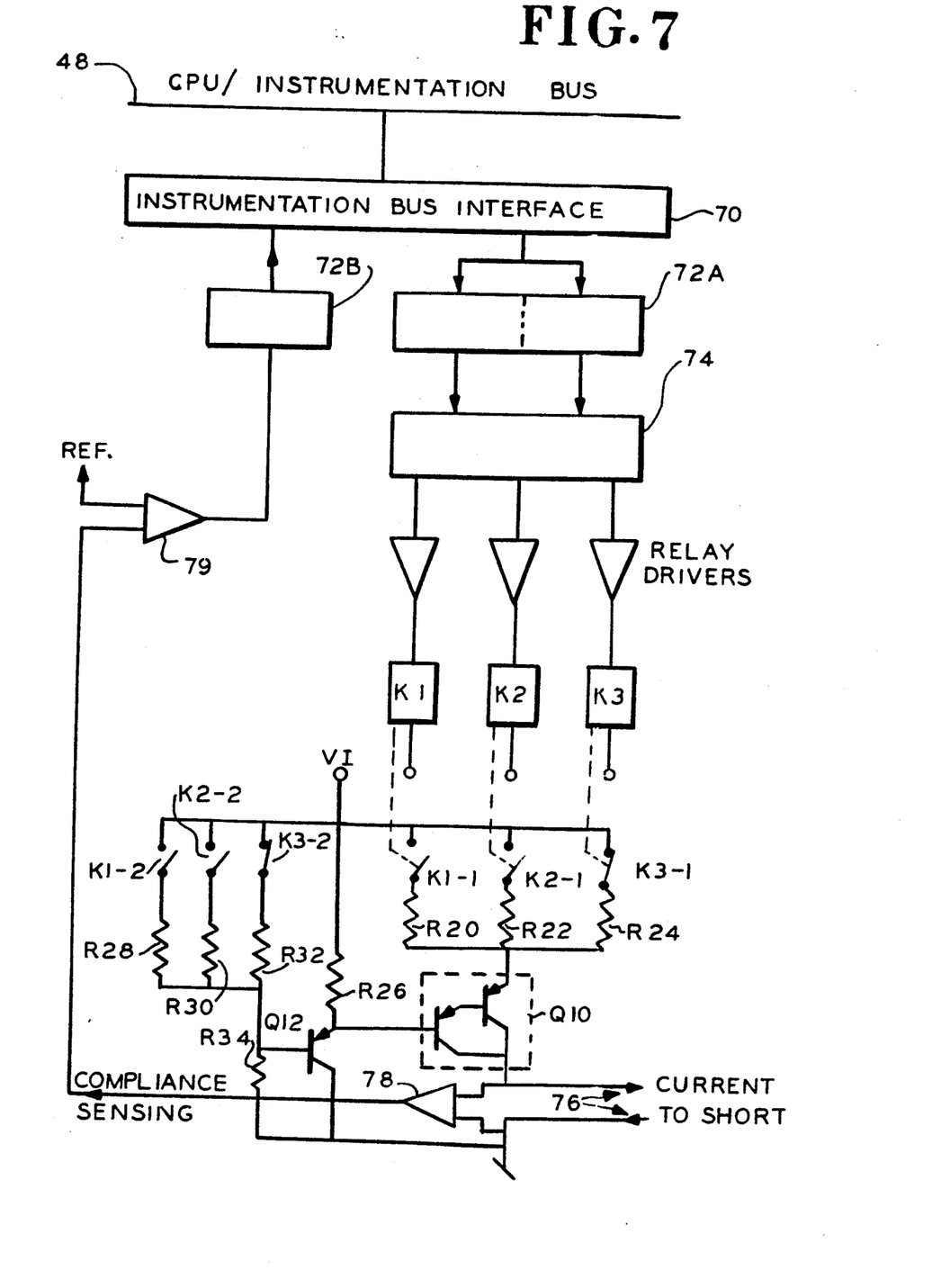
FIG. 7 is a more detailed schematic illustrating a portion of the circuitry of FIG. 5.

Referring to FIG. 7, this block diagram shows the circuit of FIG. 6 in further detail. Interface 70 can transfer data to and from previously illustrated bus 48 for the benefit of the instrumentation of FIG. 6. A digital word from the computer can be loaded into a two bit current control register 72A. A one-out-of-three decoder 74 connected to register 72 can drive relay coils K1, K2, and K3 through the illustrated buffers. Coils K1-K3 are shown driving relay contacts K1-1, K2-1 K3-1, respectively. For illustrative purposes alternative relay contacts K1-2, K2-2 and K3-2 are each shown having one terminal connected to voltage line VI, their other terminals being connected through resistors R28, R30 and R32, respectively, to the base of PNP transistor Q12. Contacts K1-1, K2-1 and K3-1 each have one terminal connected to line VI, their other terminals being connected through resistors R20, R22, and R24, respectively, to the output emitter of Darlington pair Q10. The common collector of Darlington pair Q10 connects to one of the leads 76, the other lead being grounded. Leads 76 are connected between two networks to supply a current which flows through the assumed short. The input base of Darlington pair Q10 connects to the emitter of PNP transistor Q12 and one terminal of resistor R26, whose other terminal connects to line VI. Resistor R34 connects between ground and the base of transistor Q12, whose collector is grounded.

The voltage across leads 76 is sensed by buffer 78 whose output connects to one input of comparator 79, whose other input connects to a reference voltage. The output of comparator 79 can set a bit in compliance sensing register 72B. Once set, this can provide to the computer an indication of an excessive voltage. The computer, through bus 48 and interface 70, can read the compliance sensing bit in register 72B to detect the excessive voltage. Consequently, current can be altered by switching performed through relay coils K1-K3. Alternatively, a voltage limiter can be connected across leads 76 in a fashion similar to that illustrated for FIG. 4. In the latter example a pair of diodes produces the voltage limiting.

To facilitate an understanding of the principles associated with the apparatus of FIGS. 5-7, its operational will be described in connection with the display of FIG. 8 and the flowchart of FIG. 9. At start-up, computer 40 (FIG. 5) reads the program in memory 46 and at step ST1 (FIG. 9) determines whether a board 56 (FIG. 5) is loaded against the "bed of nails" 54. This can be determined by whether current can flow through two adjacent pins ordinarily connected by conductors on the board under test. Alternatively, a limit switch (not shown) can be actuated when a board is placed against the "bed of nails" 54.

The first test will be to attempt to power the board under test by applying a voltage either directly to the power traces or to a voltage regulator on the board. The apparatus of FIG. 6 supplies power from rack 50A (FIG. 5) through switch matrix 60, pin driver PD1-PDn, and multiplexer 52 to the appropriate pins on bed 54. Computer 40 provides the necessary signals along lines 48 and 49 to accomplish these connections. Power is thus applied to the board under test 56 and the voltage across the power to ground leads is measured to determine if voltage reaches its rated value. If voltage is at zero and the current equals or exceeds the short circuit protection value of the power supply, this indicates a short from power to ground. This condition is sensed at step ST2 by connecting an appropriate voltmeter from rack 50C (FIG. 5) through matrix 60 to the board 54. If a short exists control is transferred to step ST3.

In step ST3 computer 40 relays a message to display 44 to indicate that there is a short circuit. In addition, the process can be such that various other points that are shorted can be displayed as well. Next at step ST4, the operator is asked whether he wishes to conduct the short circuits location program. If chosen, control is transferred to step ST5. At this point the operator is prompted to specify the desired current. As before, the current will be selected depending upon whether the current will be flowing through relatively small signal traces or through large ground planes. At this time, the computer issues commands along bus 48 demanding an output current from rack 50A. At the same time, commands along bus 49 have placed switching matrix 60 in a condition to inject the selected current across predetermined power leads.

Thereafter in step ST6, the operator is prompted to select a reference I.D. for the area of the board under test. This can be the serial number of the board that is being examined. Next in step ST7, the operator is prompted to give the coordinates of the board. Initially, the operator will give the coordinates of the upper left and lower right corner of the board to indicate that the entire board is under examination. Next in step ST8, the computer 40 (FIG. 5) will provide an outline on display 44 to indicate the board area being considered.

Thereafter control is transferred to step ST9, where the operator is prompted to supply the coordinates of the first pair of locations to be measured on the board under test. In step ST10 computer 40 issues a command along line 48 and 49 to connect one of the voltmeters in rack 50C to the pair of pins previously selected in step ST9. The connection is made through the pin drivers PD1-PDn and multiplexing switch 52 (FIG. 5). The voltage thus measured is loaded into a register (not shown) in rack 50C (FIG. 5) and read by computer 40 along bus 48. Now at step ST10, the magnitude of the voltage is examined. Although a modest current is chosen initially, the resulting voltage may be too large or small and, therefore, current is adjusted in step ST11 accordingly.

Next at step ST12 the operator is prompted to select additional pairs of probe positions for measurement. After additional selections are made, steps ST9 and ST10 are reexecuted and the resulting data are stored in computer memory. When the operator is satisfied enough pairs have been selected, step ST13 is executed. Consequently, all of the pairs of points selected by the operator are displayed on display 44 together with an indication of the polarity and magnitude of the voltage.

Figure 8:
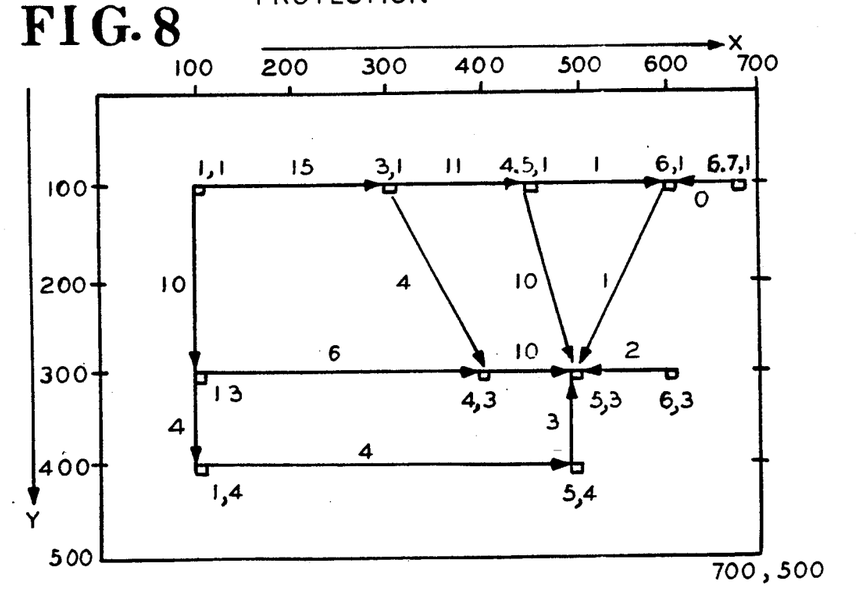
FIG. 8 is an illustration of a display generated by the apparatus of FIG. 5.
Figure 9:
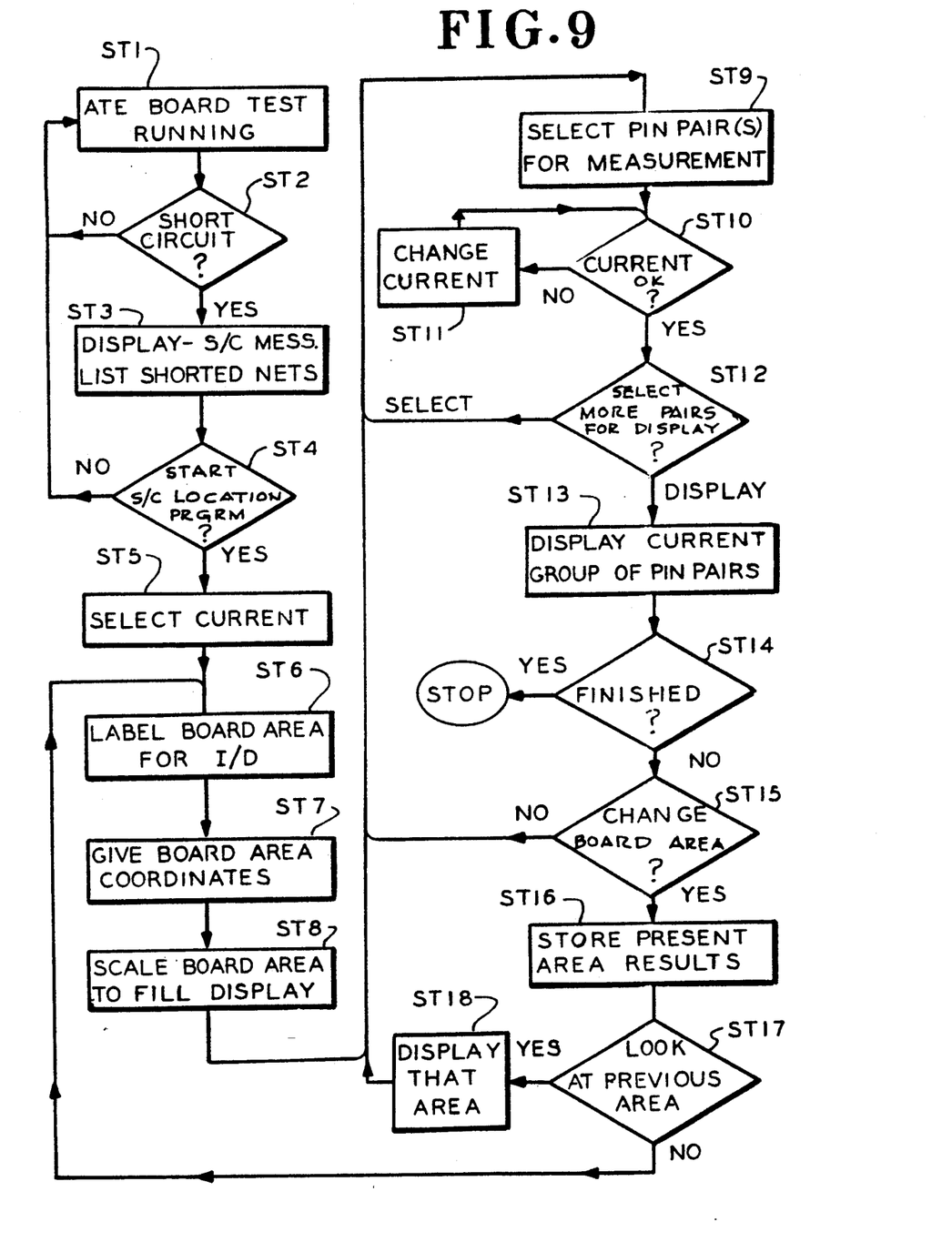
FIG. 9 is a flowchart associated with the apparatus of FIG. 5 for semi-automated operation.

Referring to FIG. 8, an exemplary display is shown having X and Y coordinates as illustrated. Each of the selected points is shown as a small square with its coordinates labeled. The polarity of voltage between points is indicated by an arrowhead with the magnitude written along the axis of the arrow. In this example, the coordinates of each point are shown as ordered pairs (only two significant digits are shown for clarity.)

Next in step ST14 the operator is asked whether he wishes to continue. If affirmative, at step ST15 the operator can elect to change board area. In step ST16, the details on the currently displayed area is stored. In step ST17 the operator is asked whether a previously examined area is to be investigated. If a previous area is reinvestigated, then step ST18 redisplays that area and transfers control to step ST9 to repeat the process just described.

If a new area is to be examined, control reverts to step ST6 to proceed in the manner previously described. Responding to prompts, the operator can give different coordinates for the upper left and lower right corners of the area to be examined. In response, the computer 40 will expand (or contract) the area under investigation. This allows the operator to have greater (or less) resolution. Thus relatively close measurements can be displayed without producing an excessively cluttered presentation.

The exemplary graphical illustration of FIG. 8 shows the result of an investigation by an operator. For example, progressing along the top edge of a circuit board the operator sees that voltage changes in magnitude from 15.0 to 11.0 to 1.0 to 0.0 mV. The rapid decrease indicates that the position of the short has been crossed. This gives an approximate X coordinate for the short. Progressing downward along the Y axis, the voltage drop changes from 10.0 to 4.0 mV. In this hypothetical, the short is at coordinate 5,3. An investigation around point 4,3 shows the indicated voltage drops of 6.0 and 4.0 mV. In contrast, the voltage drop from points 4,3 and 4.5,1 to point 5,3 is a more substantial 10.0 mV. Most notably, the voltage drop from point 5,3 to 6,3 reverses polarity giving a clear indication that the short has been bracketed. Using this graphical technique it is clear that the short can be rapidly identified. Significantly, point 5,3 is clearly distinguished since all vectors point inwardly toward it.

Figure 10:
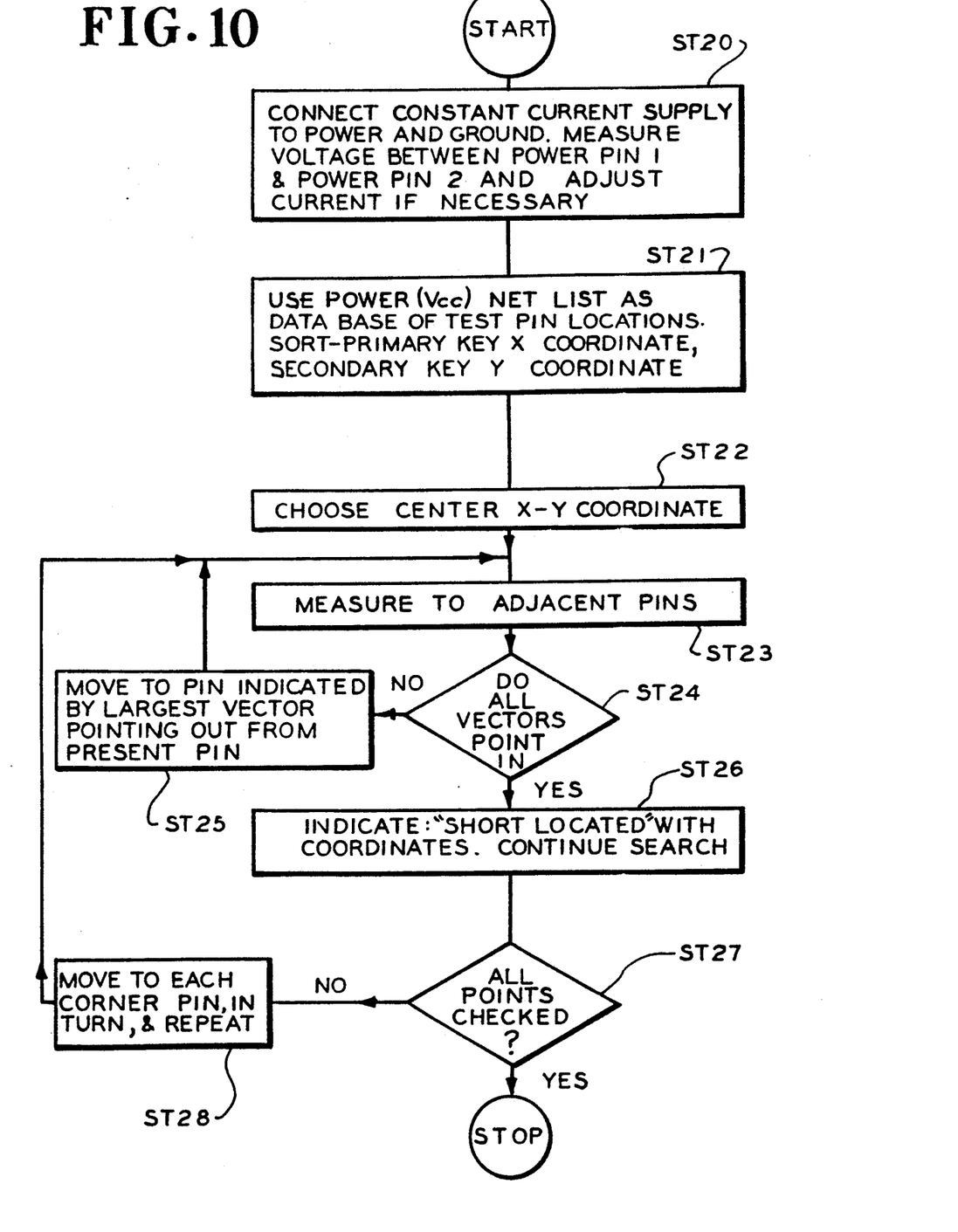
FIG. 10 is an alternate flowchart associated with the apparatus of FIG. 5 for fully automated operation.

Referring to FIG. 10, an alternative flowchart describes a highly automated embodiment. In initial step ST20, a constant current is applied between two networks, in this example power and ground. Thereafter, the voltage between the current application points are measured and adjusted as necessary. As before, the measurement and current adjustment is achieved by processor 40 (FIG. 5) operating through racks 50A-50D, which connect to the board under test 56 through switching matrix 60, drivers PD1-PDN and multiplexing switches 52, using the bed-of-nails 54. From hereafter, the co-operation of the foregoing equipment will be assumed when describing the functions performed in connection with the flowchart of FIG. 10.

In this embodiment, computer memory contains a location list for all of the pins along the network that can be usefully measured. In step ST21 this list is sorted based on its X and Y coordinates. In step ST22 a central pin is selected. The central pin is the one having X and Y coordinates that are closest to the midpoint of the board under test. Thereafter, in step ST23, voltage is measured from the central pin initially selected in step ST22 to the pins adjacent thereto. The adjacency can be defined in a number of ways. A predetermined square can be centered around the initial central pin and all pins falling within that square are considered adjacent. Alternatively, this square can be scaled to encompass a fixed number of pins, for example 10. Alternatively, the central pin is used as a center point and all pins having less than a maximum radial spacing at each azimuthal sector are considered adjacent. Clearly other definitions of adjacency are possible.

After the measurements are performed in step ST23, the computer determines in step ST24 whether all of the voltages have a predetermined polarity indicating current flows in a predetermined direction with respect to the reference pin. In this embodiment the predetermined direction for current flow is inward, although the direction can be reversed in other situations by reversing the injected current. If not, in step ST25, the computer determines which of the pins having a reverse polarity has the largest voltage. The pin thus selected becomes the new reference pin and step ST23 is repeated so that the voltage of pins adjacent to the new reference pin are remeasured with respect to the new reference pin.

Steps ST23-25 repeat until all pins adjacent to the reference pin have the same polarity, indicating inward current flow. Then step ST26 is executed wherein the computer displays a message that a short has been located, giving the coordinates. In step ST27, the computer determines whether all possible points have been measured at least once. If not, in step ST28, a new reference pin is chosen at one of the four corners of the board under test. Thereafter, the foregoing process repeats itself with the iterative steps ST23-25 converging on a short. The short may be the same or a different short.

Once convergence is achieved, then step ST27 is again executed, selecting as a reference pin, a pin near a second corner of the board under test. In this fashion, all four corners of the board are used as reference pins to determine whether convergence to another short occurs. Once all four corners have been tested, step ST27 ends the program.

In an alternate embodiment, the voltages at most or all pins are measured and stored in memory before any analysis is performed. These measurements can be made with respect to any pin, but preferably with respect to a grounded pin. Thereafter, the same sequence of decisions illustrated in FIG. 9 are performed, except that measurements are not made when and as needed. The measurements are already known and need only be fetched from memory as required. The voltage between two pins is determined as the difference between the two separate readings of those pins with respect to the 20 reference pin.

It is to be appreciated that various modifications may be implemented with respect to the above described preferred embodiments. It will be appreciated that various circuit components values can be employed to alter the magnitude of current. While discrete components are shown in some embodiments, in others they can be integrated analog circuits. Various voltage limiters can be employed including zener diodes, as well as comparator driven limiters. While digital voltage 30 meters are illustrated, other analog meters can be used instead. Also, the illustrated flowchart shows various steps, but some may be eliminated and others included without departing from the scope from the present invention. In addition various steps can be reordered in other embodiments. While a very generalized automatic test equipment is shown, in other embodiments, a dedicated system can be employed which would employ less switching. Similarly, dedicated systems can have hard wired connections to perform certain expected and repeated tests.

Obviously, many modifications and variations of the present invention are possible in light of the above teachings. It is therefore to be understood that within the scope of the appended claims, the invention may be practiced otherwise than as specifically described.

I claim:
1. A method for locating a short between a first and second planar conductor in a printed circuit, comprising the steps of:
   injecting current to cause current to flow within and between said first and section planar conductors;
   initially measuring the voltage at each one of a group of spaced points in said first planar conductor as defined with respect to an arbitrary, initial reference point, said group of spaced points being distributed about and within a predetermined distance from said initial reference point;
   identifying initial polarities from said initial reference point to each distinct one of said group of spaced points in said first planar conductor; and
   determining if the initial polarities are different from a predetermined polarity, so that the presence of the short can be determined by observing a commonly focused pattern of polarities near the short.

2. A method according to claim 1 wherein said group of spaced points are within a locality centered about said tentative one, said locality having a predetermined shape and size.

3. A method according to claim 1 wherein said group of spaced points are those within a given locality sized to include N of said spaced points, N being a predetermined number, said locality having a predetermined shape centered about said tentative one.

4. A method according to claim 1 wherein each of said group of probes are unique in that no other ones of said group, within a predetermined azimuthal spacing, are closer to said tentative one.

5. A method according to claim 1, further including the step of:

successively redefining said tentative one of said spaced points, that one of said spaced points having, with respect to the last tentative one, the largest magnitude of voltage of said predetermined polarity, being redefined as the next tentative one of said group of said spaced points.

6. A method according to claim 5 further including the step of:

regrouping said group to place in its midst the next tentative one, said group after regrouping having a predetermined minimum number.

7. A method according to claim 6, wherein said steps of successively redefining and regrouping repeats until each of said spaced points of said group is not of a predetermined polarity with respect to the last tentative one.

8. A method according to claim 7, further including the step of:

arbitrarily redefining said tentative one as a predetermined alternate point in said network;

regrouping to redefine said group as encompassing a locality centered about the last tentative one, said locality having a predetermined shape; and repetitively redefining said tentative one of said spaced points and regrouping said group, until each of the group of said spaced points is not of a predetermined polarity with respect to the last tentative one.

9. A method according to claim 1, further comprising the steps of:

replacing said initial reference point with a succeeding one of the spaced points of said group, said succeeding one having the greatest magnitude of voltage among those of said group of spaced points having said predetermined polarity;

measuring to the extent necessary the voltage at each one of a cluster of spaced points in said first planar conductor with respect to said succeeding one of said spaced points, said cluster of spaced points being distributed about and within a predetermined distance from said succeeding one of the spaced points;

identifying succeeding polarities from said succeeding one of said spaced points to each distinct one of said cluster of spaced points in said first planar conductor; and determining if the succeeding polarities are different from said predetermined polarity, so that the presence of the short can be determined by observing a focused pattern of polarities near the short.

10. A method wherein according to claim 9, wherein the steps recited in claim 9 are iteratively repeated.

11. A method according to claim 9 wherein if the greatest magnitude of voltage is also possessed by another one of those of said spaced points of said group having said predetermined polarity, the steps recited in claim 9 are repeated with said another one of said spaced points acting as said succeeding one of the spaced points of said group.

12. A method according to claim 1, wherein said first planar conductor has an assembly of spaced points which includes said group of spaced points and said initial reference point, and wherein the assembly has one or more subassemblies of spaced points, each one of the spaced points in the assembly having associated therewith one of the subassemblies, the step of identifying initial polarities is performed as follows:

with each of the spaced points within the assembly used in turn as a reference point, determining associated polarities for the associated one of the subassemblies, the step of determining if the initial polarities are different is performed by:

ascertaining for each of the spaced points within the assembly if its associated polarities are all different from said predetermined polarity, so that the presence of the short can be detected by observing a commonly focused pattern of polarities near the short.

* * * * *